United States Patent [19]

Kubozoe et al.

[11] Patent Number: 4,468,560
[45] Date of Patent: Aug. 28, 1984

[54] ELECTRON MICROSCOPE EQUIPPED WITH MEASURING FACILITY

[75] Inventors: Morioki Kubozoe; Hisasi Satow, both of Katsuta, Japan; John E. Johnson, Jr., Baltimore, Md.

[73] Assignees: Hitachi, Ltd.; Nissel Sangyo America, Ltd., both of Tokyo, Japan

[21] Appl. No.: 348,018

[22] Filed: Feb. 11, 1982

[51] Int. Cl.³ .................. G01N 23/04; H01K 37/26
[52] U.S. Cl. .................................................. 250/311
[58] Field of Search .................... 250/311; 353/40

[56] References Cited

U.S. PATENT DOCUMENTS

| | | | |
|---|---|---|---|
| 3,807,846 | 4/1974 | Swank | 353/40 X |
| 4,186,305 | 1/1980 | Taoka et al. | 250/311 |
| 4,206,349 | 6/1980 | Kamimura | 250/311 |
| 4,221,965 | 9/1980 | Konishi et al. | 250/311 |
| 4,233,510 | 11/1980 | Sato | 250/311 |

Primary Examiner—Alfred E. Smith
Assistant Examiner—Jack I. Berman
Attorney, Agent, or Firm—Antonelli, Terry & Wands

[57] ABSTRACT

Electron microscope imparted with measuring functions comprises an electron microscope system for forming an electron-microscopic image, a fluorescent screen for displaying the electron-microscopic image, and an optical microscope for observing the electron-microscopic image on the fluorescent screen. A pattern which provides convenience for measurements of the electron-microscopic image is imaged on an object plane of an eyepiece of the optical microscope.

11 Claims, 6 Drawing Figures

ELECTRON MICROSCOPE EQUIPPED WITH MEASURING FACILITY

BACKGROUND OF THE INVENTION

The present invention relates generally to an electron microscope equipped with a measuring facility. In particular, the present invention relates to an electron microscope equipped with an apparatus suited for performing measurements of an electron-microscopic image in a straightforward manner.

Heretofore, measurements of an electron-microscopic image have been made by taking a photograph of the image, wherein desired measurement is performed on the negative or diapositive with the aid of a measuring instrument provided independently of the electron microscope (i.e. indirect measurement) or by converting the electron-microscopic image into electric signals which are subsequently processed electrically for measurements (a so-called direct measurement). The former involves a large time consumption as well as a troublesome procedure because the electron-microscopic image has to be first photographically recorded. On the other hand, the direct method requires an expensive system because an apparatus for converting the electron-microscopic image into electric signals as well as an associated measuring appratus are to be additionally provided.

SUMMARY OF THE INVENTION

An object of the present invention is to provide an electron microscope equipped with a measuring facility which allows an image projected on a fluorescent screen of an electron microscope to be measured with an enhanced accuracy in a facilitated manner.

According to an aspect of the invention, there is provided an electron microscope which comprises an optical microscope for observing an image produced on a fluorescent screen of the electron microscope. A pattern which is externally produced and provides convenience for the measurement of the electron-microscopic image is focussed on an object of an eyepiece of the optical microscope, so that observation and measurement may be performed on the superposed electron-microscopic image and the pattern image.

DETAIL DESCRIPTION OF THE PREFERRED EMBODIMENT

Figure 1:
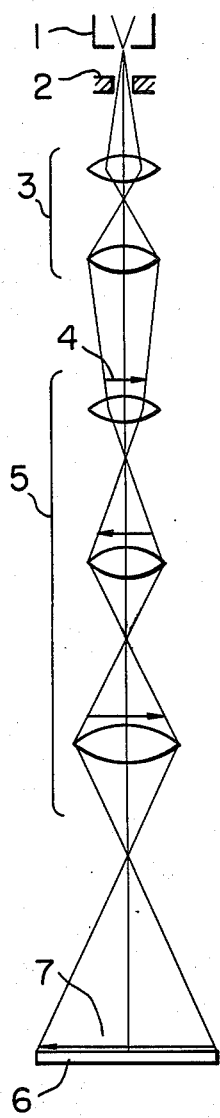
FIG. 1 schematically shows a general arrangement of an electron microscope to which the invention can be applied.

FIG. 1 schematically shows a general arrangement of an electron microscope to which the invention can be applied. In this figure, a reference numeral 1 denotes an electron gun and 2 denotes an anode. Electrons emitted from the electron gun 1 are accelerated under an accelerating voltage applied between the electron gun 1 and the anode 2. After having passed through an irradiating lens system 3, the electron beam irradiates a specimen 4. An electron-microscopic image 7 of the specimen 4 is formed on a fluorescent screen 7 by an imaging or enlarging lens system 5. In FIG. 1, the fluorescent screen 6 is shown in a horizontally positioned state, while in the state shown in FIG. 2, the fluorescent screen 6 is tilted toward an optical microscope so that the specimen image can be conveniently observed through the viewing optical microscope 8. By observing the specimen image projected onto the fluorescent screen 6 directly by eye through the optical microscope, it is possible to count the number of particular objects contained in the specimen, such as the number of mitochondoria in a biological specimen, for example. However, because it is impossible to mark the counted objects, there may be involved error in the result of the count due to possible miss or double countings. It is by far more difficult to measure the length or the like of a particular object present in the specimen with a resonable accuracy. According to the teaching of the present invention, the optical microscope 8 is provided with a specific function or performance which allows the image produced on the fluorescent screen to be measured with an improved accuracy in a facilitated manner.

Figure 3:
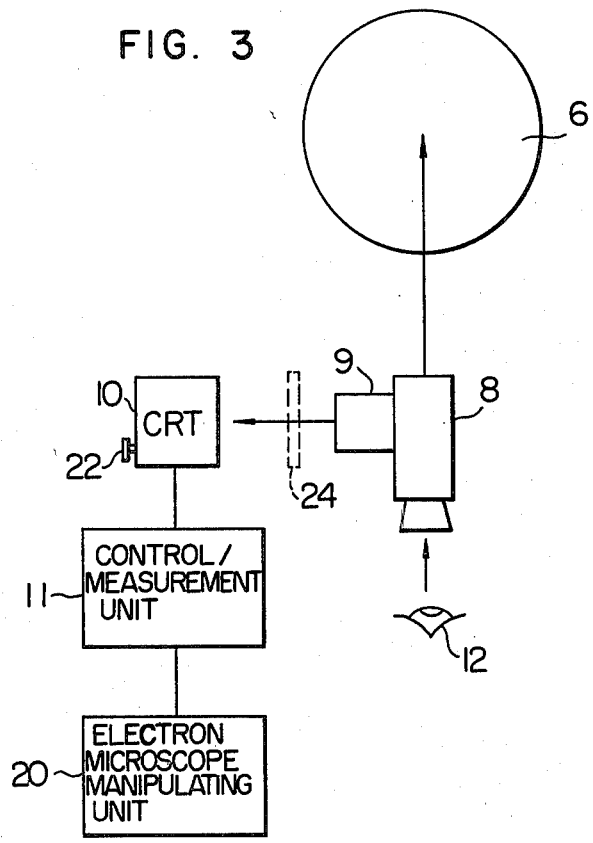
FIG. 3 shows in a block diagram a general arrangement of the apparatus implemented according to an embodiment of the invention.

FIG. 3 schematically shows a general arrangement of an apparatus according to the invention. In this figure, a numeral 6 denotes a fluorescent screen for observation of a specimen image, and 8 denotes a viewing optical microscope. A numeral 10 denotes a cathode ray tube or CRT for producing a pattern which can be advantageously and conveniently used for desired measurements of the electron-microscopic image. A numeral 9 denotes an optical means for projecting the pattern produced by the CRT 10 onto an object plane of an eyepiece of the optical microscope 8 in a focussed state. A reference numeral 11 designates a control and measuring unit provided with a computer and adapted to be manipulated by an operator 12 who observes the electron-microscopic image through the optical microscope. The control and measuring means 11 is capable of producing signals which are utilized for producing a pattern, such as those shown in FIGS. 4 and 5 on the CRT 10 in a well known manner.

Figure 4:
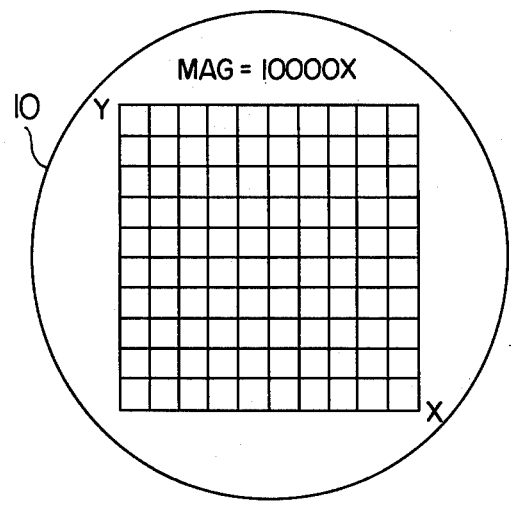
FIGS. 4 and 5 illustrate, by way of example, pattern images which provide convenience for measurements of an electron-microscopic image, respectively.

FIG. 4 shows a pattern which provides convenience in counting the number of objects contained in the image produced on the fluorescent screen 6. This pattern is formed in a lattice image comprising 100 divisions or squares arrayed in 10 columns and 10 rows. The operator 12 can thus see through the optical microscope 8 the specimen image on the fluorescent screen in the state superposed on the lattice pattern produced by the CRT 10, whereby the number of concerned objects present in the specimen can be easily counted with a high accuracy without missing or double counting by counting sequentially the objects located in the lattice divisions in the sequence from the top row of the squares to the bottom. Referring again to FIG. 3, the control and measuring unit 11 is coupled to an electron microscope manipulating unit 20 mounted on a main body of the electron microscope and can arithmetically determine the number of objects for a unit area on the basis of magnification factor as used and the counted number. The visually counted number n is entered by operating corresponding keys of a key board incorporated in the control and measuring unit 11. The number of $N_1$ per unit area is arithmetically determined by executing a program stored previously in an associated memory in accordance with the following expression:

$$N_1 = n.M^2/S \qquad (1)$$

where S represents a total area of the lattice shown in FIG. 4, and M represents the magnification factor of the electron microscope. The result of the calculation may be displayed on the CRT 10 or alternatively in a data display of the electron microscope manipulation unit.

Figure 2:
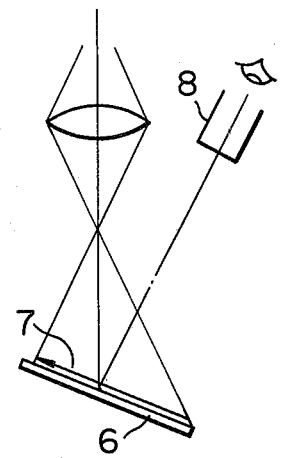
FIG. 2 illustrates an arrangement for allowing observation of an electron-microscopic image projected onto a fluorescent screen with the aid of an optical microscope.

The fluorescent screen 6 is actually positioned in an inclined state as shown in FIG. 2. When an angle of inclination of the fluorescent screen as measured relative to a plane extending orthogonally to the optical axis of the optical microscope is represented by $\theta$, the axial length of the inclined image corresponds to the length of image viewed in the orthogonal direction multiplied by $\cos \theta$. Accordingly, the precise number $N_2$ of the concerned objects dispersed in a unit area is given by the following expression:

$$N_2 = \frac{nM^2}{S \cdot \cos\theta} \qquad (2)$$

A program for executing this calculation can be readily prepared by those skilled in the art.

When the number of the divisions in which the objects in concern are present is represented by m with the number of the objects being represented by n while the division is assumed to be of a square form having a side length l, the number $N_3$ of the objects per unit area in the region where the objects are distributed is given by the following expression:

$$N_3 = \frac{n}{m} \cdot \left(\frac{M}{l}\right)^2 \cdot \frac{1}{\cos\theta} \qquad (3)$$

A program for executing the above calculation can be readily prepared by those skilled in the art and stored in the memory of the control and measuring unit 11.

Figure 5:
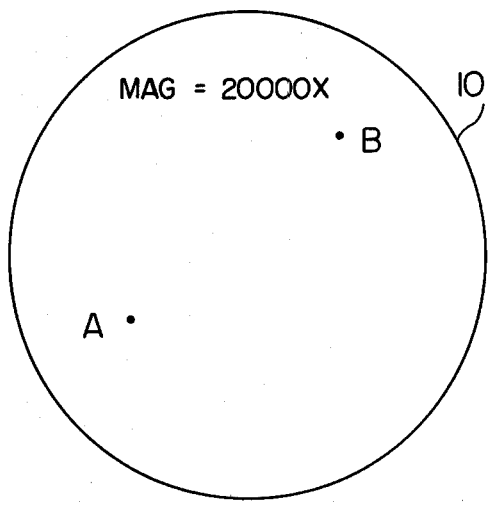

FIG. 5 illustrates another pattern produced on the screen of the CRT 10 for measuring a distance between two points. This pattern can be produced by a corresponding pattern signal generated by the control and measuring unit 11. By manipulating a control knob provided in the control and measuring unit 11, it is possible to freely vary the coordinates of the two points A and B produced on the CRT 10. Further, calculation or arithmetic determination of the distance between the points A and B can be readily made according to hitherto known methods. By way of example, there can be mentioned a method disclosed in U.S. Pat. No. 4,221,965. When the distance between the two points A and B on the screen of the CRT 10 is represented by L with the associated magnification factor of the electron microscope being represented by M, calculation of L/M is effected in accordance with a program stored in the memory. The real distance between the points A and B is displayed on the screen of the CRT 10. By the way, the data M is furnished to the control and measuring unit 11 from the electron microscope manipulating unit 20.

The length of a curved line of an electron-microscopic image can be determined by moving a point along the curved line in concern through corresponding knob operation and adding sequentially the incremental unit displacements of the moving point in accordance with a predetermined program. When occasion requires, the area of a closed circular region may be approximately determined by making use of the lattice pattern.

Figure 6:
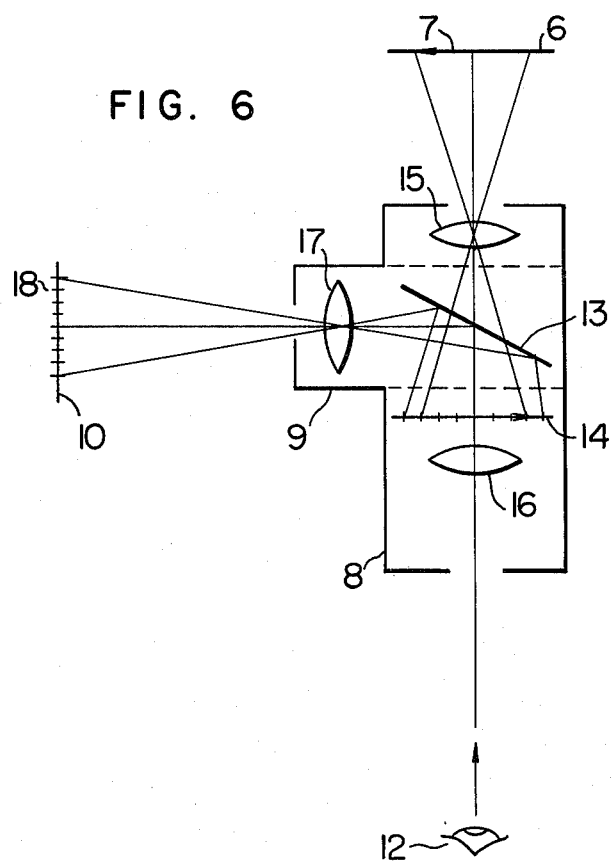
FIG. 6 shows an optical system of an optical microscope for superposing an electron-microscopic image and pattern image onto each other.

A method of superposing the electron-microscopic image produced on the fluorescent screen 6 and the pattern produced on the screen of the CRT 10 at the object plane of the eyepiece will be elucidated by referring to FIG. 6. The electron-microscopic image 7 on the fluorescent screen 6 is focussed or image onto the object plane 14 of the eyepiece 16. On the other hand, the pattern 18 of the CRT 10 is focused onto the object plane 14 by means of a lens 7 and a half-mirror 13. Since the electron-microscopic image 7 and the pattern 18 are thus superposed onto each other at the object plane of the eyepiece 16, the operator can see the superposed images as the a single or integral image through the eyepiece 16 of the optical microscope. For example, when the number of certain objects is to be determined, a lattice pattern described hereinbefore may be superposed. On the other hand, when only the electron-microscopic image is to be observed, the pattern displayed by the CRT may be caused to disappear by setting the brightness to zero by means of a brightness adjusting knob 22 or alternatively by inserting a removable shutter 24 between the CRT 10 and the optical microscope 8. Thus, observation only of the electron-microscopic image can be readily exchanged by the simultaneous observation of both the electron-microscopic image and the pattern produced by the CRT 10, a great advantage. Similar advantages can be obtained when another display, such as a liquid crystal display, is used in place of the CRT 10.

It will now be appreciated that the measurements of electron-microscopic image can be effected in a facilitated manner with a high precision.

We claim:

1. An electron microscope equipped with a measuring facility, comprising:
    means for forming an electron-microscope of a specimen;
    a fluorescent screen for displaying said electron-microscopic image;
    an optical microscope including means for observing said electron-microscopic image displayed on said fluorescent screen through an eyepiece;
    means for forming at least one pattern to be superposed onto said electron-microscopic image for effecting measurements of said electron-microscopic image; and
    means associated with said eyepiece for imaging said pattern on an object plane of said eyepiece simultaneously with the image displayed on said fluorescent screen so that said pattern and said electron microscopic image may be viewed in superposition.

2. An electron microscope equipped with a measuring facility according to claim 1, wherein said pattern forming means includes a pattern signal generating circuit for producing a pattern signal for forming said pattern, and display means for displaying said pattern in dependence on said pattern signal.

3. An electron microscope equipped with a measuring facility according to claim 2, wherein said display includes a CRT.

4. An electron microscope equipped with a measuring facility according to claim 1, 2 or 3, wherein said pattern is a lattice pattern.

5. An electron microscope equipped with a measuring facility according to claim 1, 2 or 3, wherein said pattern is constituted by a plurality of marks, and said pattern forming means includes means for selectively moving said marks.

6. An electron microscope equipped with a measuring facility according to claim 5, wherein said pattern forming means includes means for arithmetically determining the distance between said plurality of marks.

7. An electron microscope equipped with a measuring facility according to claim 1, wherein said pattern is constituted by at least a movable point, said pattern forming means including means for arithmetically determining displacements of said point.

8. An electron microscope equipped with a measuring facility according to claim 1, wherein said optical microscope includes a half-mirror for allowing one of said electron-microscopic image and said pattern to be transmitted therethrough while reflecting the other so that said electron-microscopic image and said pattern are formed in the same field of view in superposition.

9. An electron microscope equipped with a measuring facility according to claim 8, wherein said half-mirror is positioned between an objective lens and the eyepiece of said optical microscope.

10. An electron microscope equipped with a measuring facility according to claim 8, wherein said pattern forming means includes means for adjusting the brightness of said pattern.

11. An electron microscope equipped with a measuring facility according to claim 1, further including a removable shutter positioned between said optical microscope and said pattern forming means so that said pattern image can be caused to disappear from the field of view of said optical microscope.

* * * * *